United States Patent
Toyoda et al.

(10) Patent No.: US 7,936,560 B2
(45) Date of Patent: May 3, 2011

(54) COOLING DEVICE AND ELECTRONIC EQUIPMENT INCLUDING COOLING DEVICE

(75) Inventors: Hiroyuki Toyoda, Hitachinaka (JP); Akio Idei, Hadano (JP); Shigeyasu Tsubaki, Odawara (JP); Tadakatsu Nakajima, Kasumigaura (JP); Yoshihiro Kondo, Tsuchiura (JP); Tomoo Hayashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 69 days.

(21) Appl. No.: 12/544,166

(22) Filed: Aug. 19, 2009

(65) Prior Publication Data
US 2010/0073866 A1    Mar. 25, 2010

(30) Foreign Application Priority Data
Sep. 24, 2008    (JP) .............................. 2008-244279

(51) Int. Cl.
  *H05K 7/20* (2006.01)
(52) U.S. Cl. ......... 361/679.52; 361/679.46; 361/679.53; 361/689; 361/700; 361/701; 165/80.2; 165/80.5; 165/104.21; 165/104.26; 165/104.33
(58) Field of Classification Search ............ 361/679.46, 361/679.52, 679.53, 688, 689, 698–702, 361/715–727; 165/45–47, 80.2, 80.4, 80.5, 165/104.21, 104.26, 104.33, 104.34, 185; 62/259.2; 454/184; 257/706–727; 174/15.1, 174/16.3, 252
See application file for complete search history.

(56) References Cited

U.S. PATENT DOCUMENTS

| | | | |
|---|---|---|---|
| 5,946,191 A * | 8/1999 | Oyamada ...................... 361/700 |
| 6,111,751 A * | 8/2000 | Sakuyama .................... 361/704 |
| 6,549,408 B2 | 4/2003 | Berchowitz | |
| 6,621,713 B2 | 9/2003 | Amaike et al. | |
| 6,643,132 B2 * | 11/2003 | Faneuf et al. ................. 361/700 |
| 6,776,221 B2 * | 8/2004 | Montgomery et al. ......... 165/46 |
| 6,927,980 B2 * | 8/2005 | Fukuda et al. ................ 361/700 |
| 6,967,841 B1 * | 11/2005 | Chu et al. ...................... 361/700 |
| 7,012,807 B2 * | 3/2006 | Chu et al. ...................... 361/699 |
| 7,134,485 B2 * | 11/2006 | Hul-Chun ............... 165/104.26 |
| 7,286,346 B2 * | 10/2007 | Chiba et al. .............. 361/679.48 |
| 7,457,112 B2 * | 11/2008 | Fukuda et al. ........... 361/679.48 |
| 7,508,672 B2 * | 3/2009 | Hamman ...................... 361/701 |
| 7,719,837 B2 * | 5/2010 | Wu et al. ....................... 361/699 |
| 7,826,217 B2 * | 11/2010 | Kondo et al. ............ 361/679.53 |
| 7,839,640 B2 * | 11/2010 | Hayashi et al. ............... 361/699 |

(Continued)

FOREIGN PATENT DOCUMENTS
JP          52-70364        11/1950
(Continued)

*Primary Examiner* — Michael V Datskovskiy
(74) *Attorney, Agent, or Firm* — Foley & Lardner LLP

(57) ABSTRACT

A blade server including a cooling structure to be loaded with a CPU of high performance is provided. In order to enhance draining performance of a condensed working fluid which stays between fins, a vapor condensing pipe is used, in which grooves are formed in a direction substantially parallel direction with a pipe axis direction on the above described pipe inner surface, a section of a row of the above described fins is exposed on a side surface of the above described groove, the above described groove is disposed at a lower side in the vertical direction from the center line in the pipe axis direction of the vapor condensing pipe when the above described groove is installed in the above described vapor condensing pipe, and a wick with a wire space smaller than the fin space of the above described fin row is filled inside the above described groove.

7 Claims, 10 Drawing Sheets

U.S. PATENT DOCUMENTS

| | | | |
|---|---|---|---|
| 2005/0284612 A1* | 12/2005 | Machiroutu | 165/104.25 |
| 2005/0284614 A1* | 12/2005 | Machiroutu et al. | 165/104.26 |
| 2007/0267180 A1* | 11/2007 | Asfia et al. | 165/104.26 |
| 2009/0027856 A1* | 1/2009 | McCoy | 361/699 |

FOREIGN PATENT DOCUMENTS

| | | |
|---|---|---|
| JP | 61-125590 A | 6/1986 |
| JP | 61-173082 | 8/1986 |
| JP | 403087596 A * | 4/1991 |
| JP | 03-134493 A | 6/1991 |
| JP | 08-303972 | 11/1996 |
| JP | 2000-035295 A | 2/2000 |
| JP | 2002-032153 | 1/2002 |
| JP | 2002-168547 | 6/2002 |
| JP | 2003-222480 A | 8/2003 |
| JP | 2005-222443 | 8/2005 |
| JP | 2006-189232 A | 7/2006 |
| JP | 2006-275346 A | 10/2006 |

* cited by examiner

INCLINATION ANGLE

COOLING DEVICE AND ELECTRONIC EQUIPMENT INCLUDING COOLING DEVICE

BACKGROUND OF THE INVENTION

The present invention relates to a cooling device and electric equipment including the cooling device, such as blade servers.

In recent years, in blade servers, for which demand has been rapidly growing, further increase in information processing capability and space saving have been required. The information processing capability has been drastically enhanced year after year with enhancement in the performance of a single CPU. Further, by increasing the number of CPUs loaded on one blade, enhancement in the information processing capability per one blade is designed. Further, by reducing the thickness of a blade, the number of blades which can be loaded on one rack is increased.

By increase in heat generation amount following enhancement in performance of a CPU, and reduction in thickness of a blade, the heat generation density of the blade server is drastically increased. Therefore, enhancement in cooling efficiency is desired. Further, the blade servers realize high reliability by redundant design and maintenance during operation. In order to realize maintenance during operation, blades and the respective units such as a power supply unit, and fan unit are required to be attached to and detached from the rack during operation of the blade server. This is called hot swap, and is the characteristic of the blade server. Therefore, the cooling device which is loaded on the blade needs to be attachable and detachable.

Here, describing the typical configuration of a blade server, the blade server is loaded with several chassis in the rack. The chassis is loaded with a plurality of blades, power units, fan units, system units and I/O units. The blade, fan unit and I/O unit are respectively connected to the system unit through back planes. The blade which is an information processing device is loaded with electronic components such as a CPU, a memory, a chip set, and a hard disk (HDD).

The cooling method which is a mainstream at present is a method for cooling each of the electronic components by causing air to flow into the blade by a fan module loaded on a chassis. A CPU which has a large heat generation amount among the electronic components is mounted with a heat sink made of a material with a high thermal conductivity such as copper and aluminum. The heat sink mounted to the CPU has been increasing in size year by year with increase in the heat generation amount of the CPU, and enhancement in performance such as incorporation of a heat pipe has been designed.

However, while the heat generation amount of a CPU is increasing and blade thickness is being reduced, air-cooling of the CPU in the blade by attaching the heat sink to the CUP is approaching its limit.

Thus, a cooling system is conceivable, which transports generated heat of a CPU to the outside of the blade to radiate the heat by using a liquid circulating type heat transport device and a phase change type heat transport device. According to the cooling system, a large radiator and chiller can be applied as heat radiation means outside the blade, and therefore, the cooling system can handle with a large heat generation amount of the CPU. Meanwhile, in this cooling system, realization of hot swap becomes a problem. As solution means for it, there is a method for connecting the heat transport device in the blade and the heat transport device outside the blade by using a coupler. However, connection with a coupler has the risk of leakage of a liquid.

Thus, in order to prevent leakage of a liquid, use of a cooling system in which the heat transports devices inside the blade and outside the blade are completely closed is conceivable. In this cooling system, it is a heat pipe that is considered to be the most effective as the heat transport device in the blade.

A heat pipe is a device in which in a completely tightly closed pipe from which non-condensed gas is excluded, a working fluid evaporates at the heat receiving side where the heat pipe and the heat generating source are in contact with each other, and the vapor flows in the pipe and condenses at the heat radiation side in contact with a heat exchanger, whereby heat is transported. The working fluid condensed at the heat radiation side is transported to the heat receiving side by gravity and capillary force, and continuous operation Is enabled.

Conventionally, in the heat pipe, reduction in the thermal resistance and enhancement in the maximum heat transport amount have been designed. Here, the heat transport amount means the heat amount flowing to the heat radiation side from the heat receiving side of the heat pipe. The thermal resistance means the temperature difference between the heat receiving side and the heat radiation side of the heat pipe per unit heat transport amount. To have small thermal resistance means to be capable of transporting the same heat amount with a small temperature difference. When the heat transport amount reaches a certain fixed heat transport amount in a heat pipe, transport of the working fluid which is condensed at the heat radiation side to the heat receiving side is inhibited by, for example, the force of the vapor which generates at the heat receiving side, and the boiling surface at the heat receiving side runs dry (dries out) whereby the heat pipe cannot exhibit the performance. The cause of the heat transport limit is not limited to only such interference of the vapor and the working fluid. The largest heat transport amount just before the performance of the heat pipe cannot be exhibited, namely, the heat pipe reaches the heat transport limit is called the maximum heat transport amount.

Patent documents JP-A-2003-222480 and JP-A-2006-275346 describe that there are the optimum groove depths (fin heights) and groove spaces for obtaining the high maximum heat transport amount in the pipes with internal grooves.

Further, Patent document JP-A-2006-189232 describes the heat pipe which is designed to increase the maximum heat transport amount by enhancing the capillary force in the grooves between the fins by adding the second fin shape between the first fin shapes in the pipe with internal grooves.

Patent document JP-A-03-134493 discloses the structure which is designed to increase the maximum heat transport amount by separating the vapor flow and the return flow of the condensate liquid by providing an internal pipe extending to the heat radiation side from the heat receiving side in the heat pipe tube.

Patent document JP-A-61-125590 describes the structure in which by attaching a ring-shaped flat fin to the inside of the pipe with inner surface grooves for reduction in thermal resistance, the surface areas of the evaporation surface and the condensation surface are increased, and by using the inner surface grooves of the pipe for transport of the working fluid, thermal resistance is reduced while the maximum heat transport amount is kept.

Patent document JP-A-2000-35295 discloses the structure in which a region Without a groove is formed in a part of the internal groove structure in the pipe with inner surface grooves, and by flowing a condensate liquid to this region, the draining performance of the pipe is enhanced, the grooves which can be also expressed as fins are prevented from being covered with an excessive amount of the condensate liquid, and thermal resistance is reduced.

BRIEF SUMMARY OF THE INVENTION

In recent years, a product called a blade server has been widespread, which realizes reduction of the physical space by loading the elements necessary as a computer such as a CPU, a memory, and an HDD on one thin blade, housing a plurality of such blades in a casing called a chassis or the like, and communalizing a power supply, a cooling fan, and input and output of information such as a LAN in the chassis. One blade has the same function as one server, and by loading a plurality of the blades on a chassis, the blade server has the characteristic of high mounting density of servers as compared with the other server equipment having about the same volume as the chassis.

Incidentally, it is generally known that a CPU of higher performance has a lager heat generation amount, and when the temperature reaches the operation guaranteed temperature or higher, its performance is not exhibited. Therefore, the electronic equipment loaded with a CPU needs to have some heat radiation structure corresponding to the heat generation amount. Conventionally, a blade has adopted the structure in which heat radiation fins are attached to the CPU for cooling the CPU, and air is passed to the fins from the fan unit attached to the chassis. However, in order to realize high density mounting which is one of its characteristics, the size of the heat radiation fins for the CPU attached to the blade, and the place for mounting them have large constraints. Therefore, it becomes difficult to load a high performance CPU with a large heat generation amount on a blade.

Thus, as a method for loading a high performance CPU while keeping the mounting density of the blade, a structure is considered as one example, which transports the heat of the CPU to the chassis side which has a spatial allowance by using heat transport means such as a heat pipe, and performs heat radiation by attaching large heat radiation fins to the transport destination, for example.

The method of radiating the heat of the CPU with the heat radiation fins provided at the chassis side can significantly reduce the thermal resistance of the heat radiation fins itself as compared with the conventional method of attaching the heat radiation fin directly above the CPU. However, the thermal resistance corresponding to the heat transport means such as a heat pipe which is newly provided between the CPU and the heat radiation fin is added. Therefore, the heat pipe is required to reduce the thermal resistance as much as possible.

Further, in order to keep the blade size (especially, the thickness) which does not impairs the characteristic of the blade server that the mounting density is high, the thickness of the pipe which is allowed for the heat pipe is limited. The thickness of the pipe has a large influence on the flow resistance when the vapor at the heat receiving side moves to the heat radiation side. If the flow resistance is large, the pressure difference between the heat receiving side and the heat radiation side (the heat receiving side is at a high pressure, whereas the heat radiation side is at a low pressure) becomes large. Therefore, return of the condensate liquid is suppressed and the maximum heat transport amount reduces. As the method for reducing the flow resistance by making the thickness of the pipe the same, it is effective to select the working fluid having large latent heat of vaporization per unit volume of vapor, and reduce the amount of the vapor which flows with respect to the same heat generation.

In the heat pipe using copper as its material, water is considered to be a working fluid which has high latent heat of vaporization and specific heat as compared with the refrigerants frequently used in air-conditioners and the like, and is effective in reducing the thermal resistance. However, as compared with the refrigerants for air-conditioning, water has high surface tension, and especially in the pipe having fins with narrow spaces, condensed water may be lifted up by the fins due to capillary force, and may be held between the fins. It is known that the heat transfer coefficient characteristic of the fins in the vapor condensing pipe depends on the liquid film thickness on the fin surface and as the liquid film becomes thicker, the performance becomes lower. If the condensed liquid is held between the fins, the liquid film thickness on the fin surface increases correspondingly, and the thermal resistance of the fins is increased.

In order to increase the area of the fins to increase the effective radiation area, and to reduce the thermal resistance of the fins, reducing the space between the fins is one of the effective means. However, the fin space is the factor of increasing the influence of the capillary force, and there exists the problem that unless the fin space is determined with consideration being given to the surface tension of the working fluid and the like, the working fluid is held between the fins, and the performance obtained by increasing the area of the fins cannot be exhibited.

Next, as the characteristic of the structure of the blade server which is a main target of the present invention, there is cited the characteristic that only some of the blades can be attached and detached to and from the chassis during operation in the blade server. Due to the characteristic, as the merit of the blade server, favorable maintainability is cited. Further, the blades are often designed to be attached and detached in the horizontal direction (direction perpendicular to the gravity direction) with respect to the horizontal installation surface such as a floor. In order to keep the attachability and detachability, in the blade with heat transport to the chassis taken into consideration, the heat pipe portion which is protruded from the blade needs to be placed in the blade attaching and detaching direction (horizontal direction). For this reason, in the present invention, especially in the heat pipe in which the heat radiation side is disposed substantially horizontally, it becomes one of the problems to reduce the thermal resistance, and simultaneously ensure the maximum heat transport amount which is the total heat generation amount of the CPUs loaded on the blade that can be transported to the heat radiation fins.

Further, when consideration is given to attachment and detachment of the blade, the heat radiation side of the heat pipe, which is protruded to the chassis side from the blade, needs to have minimum protrusion on the heat pipe outer surface. With this, as the heat radiation side of the heat pipe, in the vapor condensing pipe which is protruded to the chassis side from the blade, it is not desirable to adopt the structure in which vapor is caused to flow in from the end of the blade side, the condensate liquid return pipe is attached to the end of the chassis side which is protruded from the blade, and the piping is extended to the blade side.

The heat sink which cools the CPU with a large heat generation amount naturally has large flow resistance as compared with the heat sink which cools a CPU with a small heat generation amount. Therefore, when a large heat sink is provided at the chassis side in order to cool a CPU with a large heat generation amount, in the condition of the same fan rotation speed, the flow rate of the air flowing over the blade surely becomes small as compared with the flow rate at the time of cooling the CPU with the conventional heat generation amount. With this, the temperature of the semiconductor device such a memory with a small heat generation amount as compared with a CPU, which does not especially become a problem conventionally, is likely to become a problem.

The fin shape shown in each of JP-A-2003-222480 and JP-A-2006-275346 has the area enlargement rate of about 2.5 times at the largest as compared with the area of the pipe without grooves with the same inside diameter. Specifically, even if the area enlargement amount can be all effectively used, the upper limit of the heat radiation performance becomes higher by 2.5 times. However, area enlargement by 2.5 times or more is enabled by applying plastic working to the pipe inner surface. In JP-A-2003-222480 and JP-A-2006-275346, the inner surface grooves themselves are used as the liquid return passage, which is the passage for returning the working fluid condensed at the heat radiation side to the heat receiving side. This means that the roots of all the fins are surely submerged in water as the liquid return passage. The effective heat transfer coefficient of the fins reduces due to submergence, which becomes the cause of increasing the thermal resistance of the condensing part.

The invention disclosed in JP-A-2006-189232 is also on the premise of use of all the inner surface grooves as the liquid return passage, and therefore, the maximum heat transport amount is considered to increase as a result of liquid return being promoted, but significant reduction of the thermal resistance is not brought about.

As one of the factors that decrease the maximum heat transport amount in the heat pipe, it is described in the Background of the invention that the working fluid is forced to flow by the vapor at a high flow velocity, and the heat receiving side is dried out, when the vapor flow, which is the flow of the vapor generating at the heat receiving side to the heat radiation side, and the liquid return flow, which is the flow of the working fluid condensed at the heat radiation side returning to the heat receiving side, are opposed to each other. As the structure for preventing, the decrease of the maximum heat transport amount, there is a heat pipe called a loop type heat pipe in which the vapor pipe for passing vapor flow and the condensate liquid return pipe for passing liquid return flow are separate. In such a loop type heat pipe, the liquid return flow does not interfere with the vapor flow, and therefore, the maximum heat transport amount is increased.

JP-A-03-134493 describes the invention adopting the configuration of the loop type heat pipe with a large maximum heat transport amount without changing the external shape as the heat pipe which is formed by only a single pipe by adding the internal pipe extending to the heat radiation side from the heat receiving side in the pipe.

However, as the factors that decreases the maximum heat transport amount in the heat pipe, there is also cited the fact that the pressure difference between the heat receiving side and the heat radiation side makes it difficult for the condensed working fluid to return to the heat receiving side at a high pressure, other than the factor that the vapor flow and the liquid return flow are opposed to each other, as is described above. The flow rate of the vapor flow is generally much higher as compared with the flow rate of the liquid return flow, and thereby, the flow velocity of vapor is much higher. Therefore, it becomes the predominant view that the largest factor that causes the pressure difference between the heat receiving side and the heat radiation side is the pressure loss of the vapor flow.

In consideration of this, in the structure shown in JP-A-03-134493, the configuration of the ordinary loop type heat pipe is concentrated in one heat pipe, and therefore, the passage sectional area of the vapor pipe is restricted, so that the pressure loss of vapor tends to be large.

When a liquid pool of the working fluid is provided at the heat receiving side in order to suppress dryout, and cooling by pool boiling is performed, droplets of the working fluid which are raised by boiling may flow into the vapor pipe in addition to vapor. Therefore, it is conceivable that the droplets close the section of the fine inner pipe.

In order to solve this problem, the inner pipe in which vapor flows needs to be made thick, but for this purpose, the outer pipe needs to be made thick at the same time. Thus, in the blade server which is considered as the target of the present invention, the constraint of the outside dimension of the pipe is large, and therefore, this structure is not suitable.

When the passage of the condensate liquid return pipe is long and the level difference is small in such a loop type heat pipe, it is conceivable that the liquid return flow may be cut off halfway. In this case, surface tension of the liquid interface due to the cut portion occurs. Therefore, the condensate liquid does not flow well, which can become the cause of reduction in the maximum heat transport amount. As the countermeasures against the flow being cut off halfway, continuing to hold the liquid by the capillary force by the wick and grooves of the pipe is cited. However, these structures become the cause of large flow resistance, and when the passage is long, it is conceivable that the working fluid does not flow.

In JP-A-61-125590, a large area increase is obtained by using the pipe having the grooves in the pipe axis direction on the inner surface and adding the ring fins on the grooves. In addition, the pipe inner surface grooves are given the function of sucking the condensed working fluid from the ring fin roots by the capillary force of the grooves and the function as the liquid return fluid.

However, considering the use in the posture close to horizontality, much of the condensed working fluid stays in the lower side in the pipe by the action of the gravity. Especially because tall ring fins are used, the condensed working fluid stays to the ring fin height from the lower surface of the pipe, and the fins in the lower side in the pipe which are submerged in water are considered to exhibit no performance. Further, from the fact that much of the condensed working fluid flows to the lower side in the pipe, the inner surface grooves of the pipe at the upper side in the pipe are considered to exhibit no function as the liquid return passage which returns the working fluid to the heat receiving side. Existence of the grooves and fin portions which cannot exhibit the function like this is disadvantageous in the conditions with the constraints in the outside dimension of the heat pipe. Use itself of the fins which are too tall may cause the outer dimension of the pipe to be large for the purpose of securing the vapor passage.

JP-A-2000-35295 shows the structure in which the region without a groove (fin) is provided in the heat transfer pipe with inner surface grooves, and the fins are laterally symmetrical from the center and each fin has an angle with respect to the pipe axis direction. In this invention, in the vapor condensing side, by the vapor flow, the working fluid condensed between the fins is collected in the region without a groove, and the condensate liquid collected in the grooves is caused to flow in the vapor flow direction. The region without a groove extends in the axial direction of the pipe, and therefore, it is optimum as the liquid return passage. However, in an ordinary heat pipe, the flow of vapor and liquid return flow are opposed to each other, and this method is unsuitable.

An object of the present invention is to provide a cooling device capable of reducing thermal resistance as much as possible within an outside dimension corresponding to a blade size without impairing the maximum transport amount performance, and electronic equipment including the cooling device.

The above described object is achieved in a cooling device including a blade containing an electronic circuit board having a plurality of semiconductor devices, a chassis allowing electric and mechanical attachment and detachment by swapping the blade, a heat pipe having a heat receiving part receiving heat of a CPU mounted in the blade and a vapor condensing pipe performing heat radiation, and a radiator attached to a surface of the vapor evaporating pipe, in which the cooling device of the vapor condensing pipe extends in a swap direction of the blade, by providing a spiral fin on an inner wall of the vapor condensing pipe, providing a groove in a longitudinal direction of the vapor condensing pipe so as to divide the fin, and filling a wick in the groove.

Further, the above described object is achieved by that the heat pipe has a liquid pool portion for a working fluid in a portion where the heat receiving part is in contact with a heat source, a working fluid level in the liquid pool portion is located at a lower side in a vertical direction from a bottom surface of the groove of the vapor condensing pipe, and the heat pipe has first piping connecting an upper portion from the working fluid level of the liquid pool portion and the vapor condensing pipe, and second piping connecting a lower portion from the working fluid level of the liquid pool portion and the vapor condensing pipe.

Further, the above described object is achieved by connecting the second piping to the lower side of the vapor condensing pipe of the heat pipe in the vertical direction.

Further, the above described object is achieved in a cooling device including a blade containing an electronic circuit board having a plurality of semiconductor devices, a chassis allowing electric and mechanical attachment and detachment by swapping the blade, a heat pipe having a heat receiving part receiving heat of a CPU mounted in the blade and a vapor condensing pipe performing heat radiation, and a radiator attached to a surface of the vapor evaporating pipe, in which the cooling device of the vapor condensing pipe extends in a swap direction of the blade, by providing a fin in a spiral direction on an inner wall of the vapor condensing pipe, providing a groove in a longitudinal direction of the vapor condensing pipe so as to divide the fin, and filling a wick in the groove.

Further, the above described object is achieved by that the portion of a heat receiving surface of the heat pipe, which is in contact with the heat source, has a fin or a porous surface.

Further, the above described object is achieved by that the CPU is cooled with the heat pipe, and at the same time, some of semiconductor devices other than the CPU are cooled by the second piping via a heat conducting member.

According to the present invention, a cooling device capable of reducing thermal resistance as much as possible within an outside dimension corresponding to a blade size without impairing the maximum heat transport amount performance.

Other objects, features and advantages of the invention will become apparent from the following description of the embodiments of the invention taken in conjunction with the accompanying drawings.

DETAILED DESCRIPTION OF THE INVENTION

Hereinafter, one embodiment of the present invention will be described in accordance with the drawings.

Embodiment 1

Figure 1:
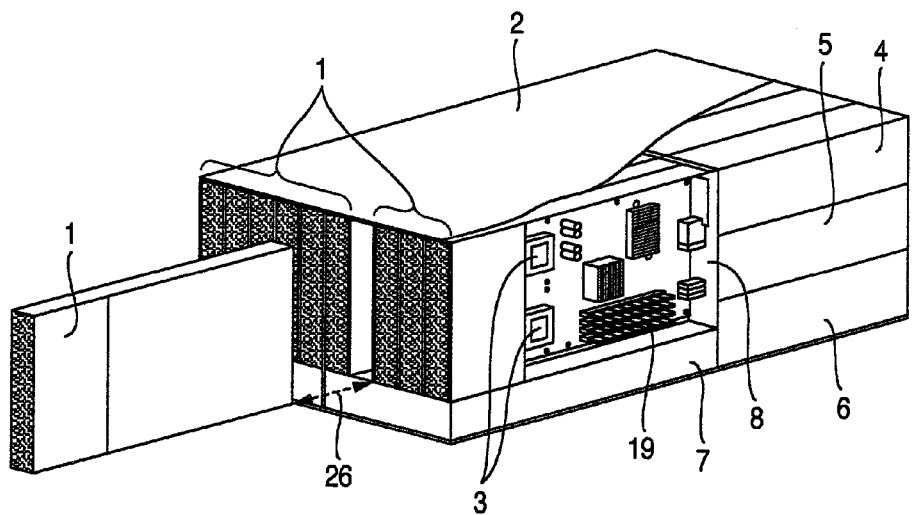
FIG. 1 is a view showing a schematic configuration of a blade server to which the present invention is applied.

FIG. 1 is a perspective view for explaining a schematic configuration of an ordinary blade server.

In FIG. 1, the blade server is configured by a server device which is called a thin blade 1 constituted of necessary elements as a computer such as a CPU 3, a memory 19 and an HDD, and what is called a chassis 2 which is mounted with a plurality of blades and constituted of devices and the like which perform power supply to the blades, and perform input and output of information to and from an external part, such as a LAN. Though the details are not illustrated, in the chassis 2, a fan unit 4 loaded with a fan for cooling the entire blade server, an I/O unit 5 to be an interface for performing input and output of information to and from the external part such as a LAN, a power supply unit 6 which performs power supply, a system unit 7 which performs management of the blade and the like are electrically connected by a back plane 8. By adopting these configurations, the blade server is characterized by being able to be mounted with servers with high density, and being excellent in maintainability with each unit being attachable and detachable.

Figure 10:
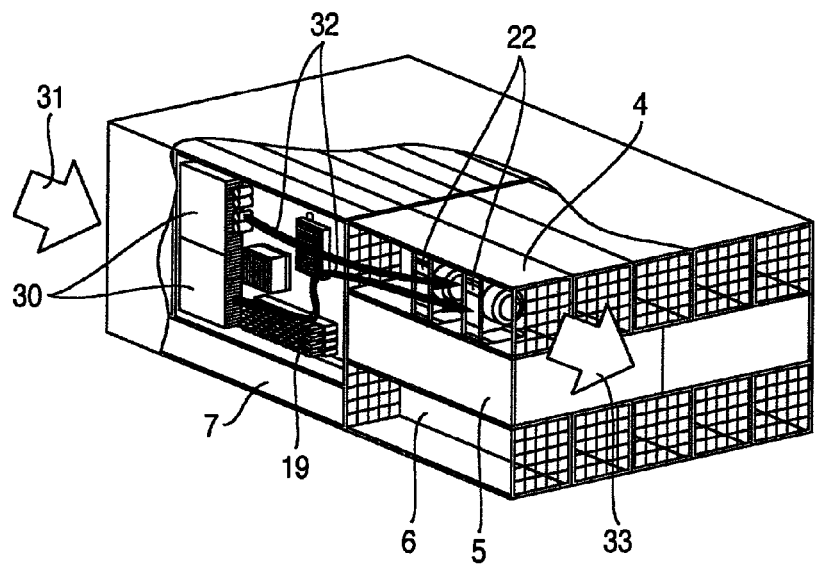
FIG. 10 is a view showing a cooling method of a conventional blade server.

FIG. 10 is a perspective view for explaining a schematic configuration of an ordinary blade server.

In FIG. 10, it is generally the CPU 3 that generates the largest heat generation amount in the blade server and needs heat radiation. The CPU 3 is an important semiconductor device in the computer which performs various numerical calculations, information processing, equipment control and the like by programs. The operation guaranteed temperature of the CPU 3 is defined by the surface temperature of the CPU 3 in many cases. The operation guaranteed temperature differs depending on each CPU, but is a temperature of about 70 to 80° C. in many cases.

A blade server is installed so that a user is accessible to the side for swapping blades in many cases. From this, due to relative easiness in taking in conditioned air, and in order to suppress transmission of noise of the fan to the user side, the air by the fan unit 4 which cools the inside of the blade server is passed to the fan unit 4 side (exhaust direction 33) from the side for swapping blades of the chassis (air inflow direction 31) in many cases.

In the conventional cooling structure, heat is radiated by using a heat sink 30 for cooling the CPU attached to the CPU 3 in the blade and air flow by a fan 22 in the fan unit 4 (see the air flow arrows 32 in the blade server). However, since the electronic circuit board of the blade is loaded with the components in addition to the CPU 3, and the thickness of the blade is limited, the size of the heat sink which can be attached to the CPU 3 is limited.

Further, server equipment is frequently loaded with a plurality of CPUs 3 for enhancing its performance, and in this blade server, one blade is loaded with a plurality of CPUs 3 in many cases. With this, a space which can be used for one heat sink for cooling the CPU on the blade is limited.

The heat generation amount of the CPU 3 generally tends to be larger as the CPU 3 has a higher performance. However, in the heat sink of which size is limited by the conditions as described above, the amount of heat which can be radiated is limited, and therefore, the performance of the CPU 3 which can be loaded is limited.

In order to solve the problem, the structure is studied, in which the heat of the CPU 3 is transported outside the blade instead of being radiated with the heat sink in the blade, and a heat sink is provided in the chassis with high spatial redundancy.

Figure 2:
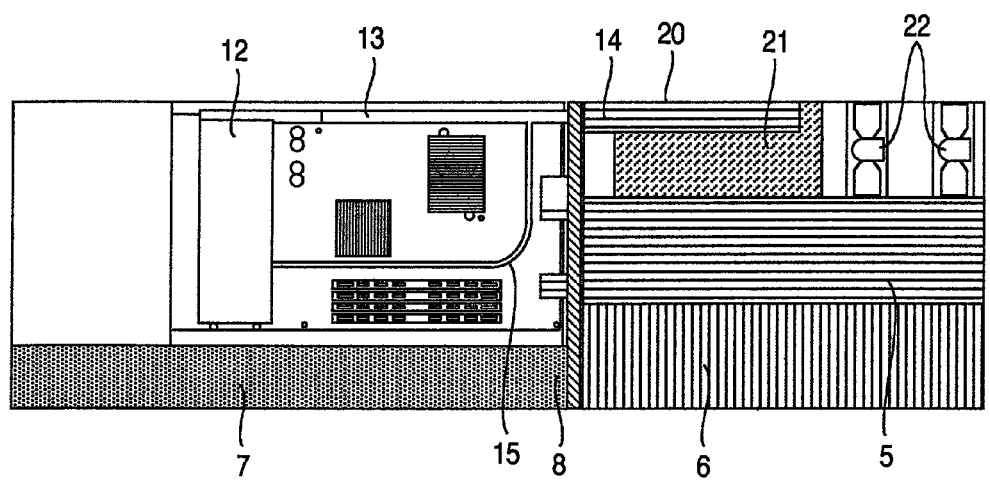
FIG. 2 is a view showing a configuration of the entire blade server of an embodiment according to the present invention.

FIG. 2 is a side view of a blade server including one embodiment of the present invention.

In FIG. 2, a thermal connector 20 enables thermal connection with a heat pipe 12 at the time of insertion of the blade 1, but does not inhibit attachability and detachability of the blade 1. As a concrete example, a mechanism is conceivable, which fastens the heat pipe 12 with a sheet having high thermal conductivity therebetween at the time of insertion of the blade 1, and relieves the fastening force at the time of removing the blade 1.

The heat pipe 12 is mounted to the CPU 3, and the heat of the CPU 3 is transported to the chassis 2 side from the blade 1. The end of the heat pipe 12 is connected to the thermal connector 20 when the blade 1 is loaded on the chassis 2, and the thermal connector 20 itself is connected to a radiator 21 by piping. By a fluid which flows inside the piping, the heat is transmitted to the radiator 21 from the thermal connector 20. From the radiator 21, the heat is exhausted outside the equipment by the air by the fan 22. Vapor which generates by boiling of a working fluid passes through a vapor pipe 13, and is cooled in a vapor condensing pipe 14 which is at the heat dissipation side to be condensed. The condensed liquid flows in a condensation liquid return pipe 15 and returns to a working fluid chamber (which will be described later), whereby, the heat pipe 12 can continue to operate.

With the flow of the vapor, the pressure at the heat receiving side is in a state higher than the pressure at a heat radiation side. A working fluid level (which will be described later) in a working fluid chamber (which will be described later) and the vapor condensing pipe 14 are disposed so that a level difference of the working fluid level and the vapor condensing pipe 14 have a head difference exceeding the sum of the fluid resistance of the vapor flowing in the vapor pipe 13 and the fluid resistance of the condensate liquid which flows in the condensate liquid return pipe 15.

The thermal connector 20 and the radiator 21 are loaded in the fan unit 4, and therefore, the volume of the entire blade server is not changed significantly. Part of the air generated by the fan 22 is taken in from the front of the blade 1 as in the general structure, and cools the semiconductor devices and heat generators other than the CPU 3 which are loaded on the blade. Further, part of the heat of the CPU 3 can be radiated from the surface of the heat pipe 12 by the air, which leads to enhancement in the heat radiation performance of the blade 1.

Figure 3:
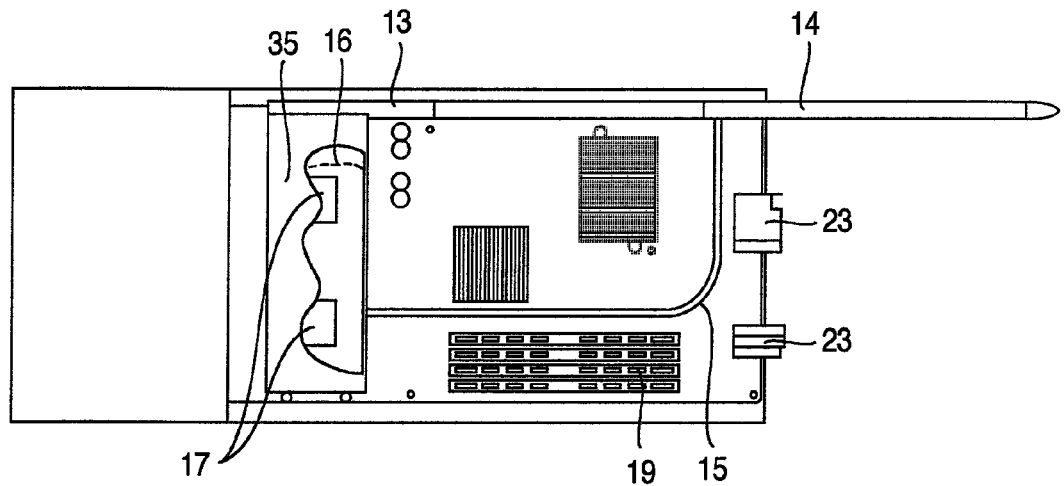
FIG. 3 is a view showing an internal structure of a blade portion which is removed from a chassis of an embodiment according to the present invention.

FIG. 3 is a side view showing an internal structure of the blade which is removed from the chassis.

In FIG. 3, the heat pipe 12 has a working fluid chamber 35 attached to the CPU 3. The working fluid boils in the working fluid chamber 35, and thereby, the temperature of the CPU 3 is kept to be the operation guaranteed temperature or lower. Further, by making the size of the working fluid chamber 35 large in the CPU mounting surface direction of the blade 1, the structure capable of cooling two of the CPUs 3 at the same time is made. In the present embodiment, water is used as the working fluid. As a heat receiving surface 17 which receives heat of the CPU 3, a porous structure which promotes boiling is adopted. Generally, a porous surface is known to require only a smaller difference between the superheating surface temperature at which boiling starts and the temperature of the working fluid as compared with a smooth surface. In order to cool the two CPUs 3 at the same time, the working fluid level 16 needs to be at the height at which the two heat receiving surfaces 17 are immersed in the working fluid.

The vapor which is generated by boiling of the working fluid in the working fluid chamber 35 which is at the heat receiving side passes through the vapor pipe 13, and is cooled condensed in the vapor condensing pipe 14 which is at the heat radiation side. The condensed liquid flows in the condensate liquid return pipe 15 and returns to the working fluid chamber 35, whereby the heat pipe 12 continues to operate.

With flow of the vapor, the pressure at the heat receiving side is in the state higher than the pressure at the heat radiating side. The working fluid level 16 in the working fluid chamber 35 and the vapor condensing pipe 14 are disposed so that the level difference of the working fluid level 16 and the vapor condensing pipe 14 has a head difference which exceeds the sum of the fluid resistance of the vapor flowing in the vapor pipe 13 and the fluid resistance of the condensing liquid flowing in the condensing liquid return pipe 15. In FIG. 3, the working fluid level 16 is at a position higher than the heat receiving surface 17 at the upper side. However, since the working fluid is absorbed into the heat receiving surface 17 by the surface tension of the porous surface, and the liquid level moves up and down by air bubbles generated by boiling, the working fluid level 16 actually does not have to be at the height at which the heat receiving surface 17 is completely immersed by the working fluid, and in order to ensure a head difference, the liquid amount is adjusted to be small.

The blade 1 is electrically connected to a back plane 8 (shown in FIG. 1) by a connector 23 at the time of insertion of the chassis 2. Further, the other units (the fan unit 4, I/O unit 5, power supply unit 6, system unit 7 and the like) in the chassis 2 are also electrically connected to the back plane 8 with connectors.

Incidentally, the vapor condensing pipe 14 of the heat pipe 12 loaded on the blade 1 needs to be extended into the fan unit 4 which is installed in the radiator 21 in order to connect to the thermal connector 20. An opening needs to be prepared in a portion of the back plane 8 where the heat pipe 12 passes. However, the back plane 8 has connection portions of various connectors, and therefore, the size of the opening is limited.

Thus, in order to take a large contact area with the thermal connector 20 while considering swappability of the blade 1, and considering that the opening of the back plane 8 cannot be made large, the vapor condensing pipe 14 is formed into the shape of the circular pipe extended in the swap direction in the present invention.

In order to reduce the thermal resistance of the heat pipe 12, heat transfer characteristics of the heat receiving side and the heat radiation side need to be enhanced. As is already described, in the present embodiment, the boiling performance is enhanced by adopting the porous shape for the heat receiving surface, and reduction in the thermal resistance at the heat receiving side is designed. In contrast with this, for reduction in the thermal resistance at the heat radiation side, increase of the surface on which the heat exchange is performed is effective.

Figure 4:
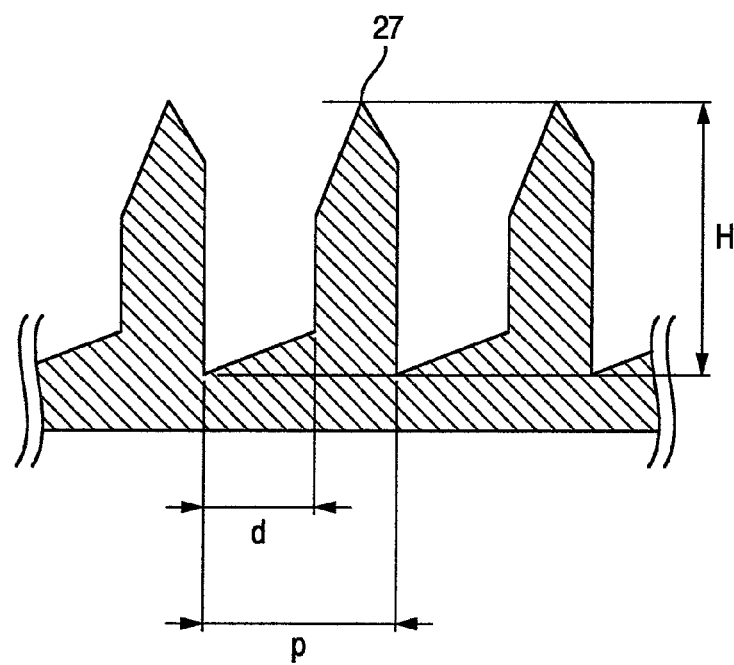
FIG. 4 is a view showing a fin sectional shape of a vapor condensing pipe of an embodiment according to the present invention.

FIG. 4 is a partial sectional view showing a fin shape in the vapor condensing pipe including the present embodiment.

In FIG. 4, in order to design increase in the area of the inner surface of the condensing pipe, a fin height H needs to be made high, and a fin pitch p needs to be narrowed. However, if the fin height H is made too high, the passage for the vapor in the vapor condensing pipe 14 is narrowed, and the pressure loss to the heat radiation side from the heat receiving side is increased, which also causes return of the condensation liquid worse. Thus, it is effective to narrow the fin pitch p. In the present embodiment, the fin with a fin pitch p of less than 1 mm, a fin height of about 1 mm is used, and the area enlargement rate is set to be higher by about 3.8 times. However, the fin is not limited to the above described one, and any similar fine fin can be used. It is also known that by sharpening a fin tip end 27, the liquid film thickness can be made thin.

Though described in the column of the Problem to be solved, in order to use the fin with the narrow fin pitch p, and a narrow fin space d with this, the structure which enhances the discharge performance of the liquid held between the fins is required.

Figure 5:
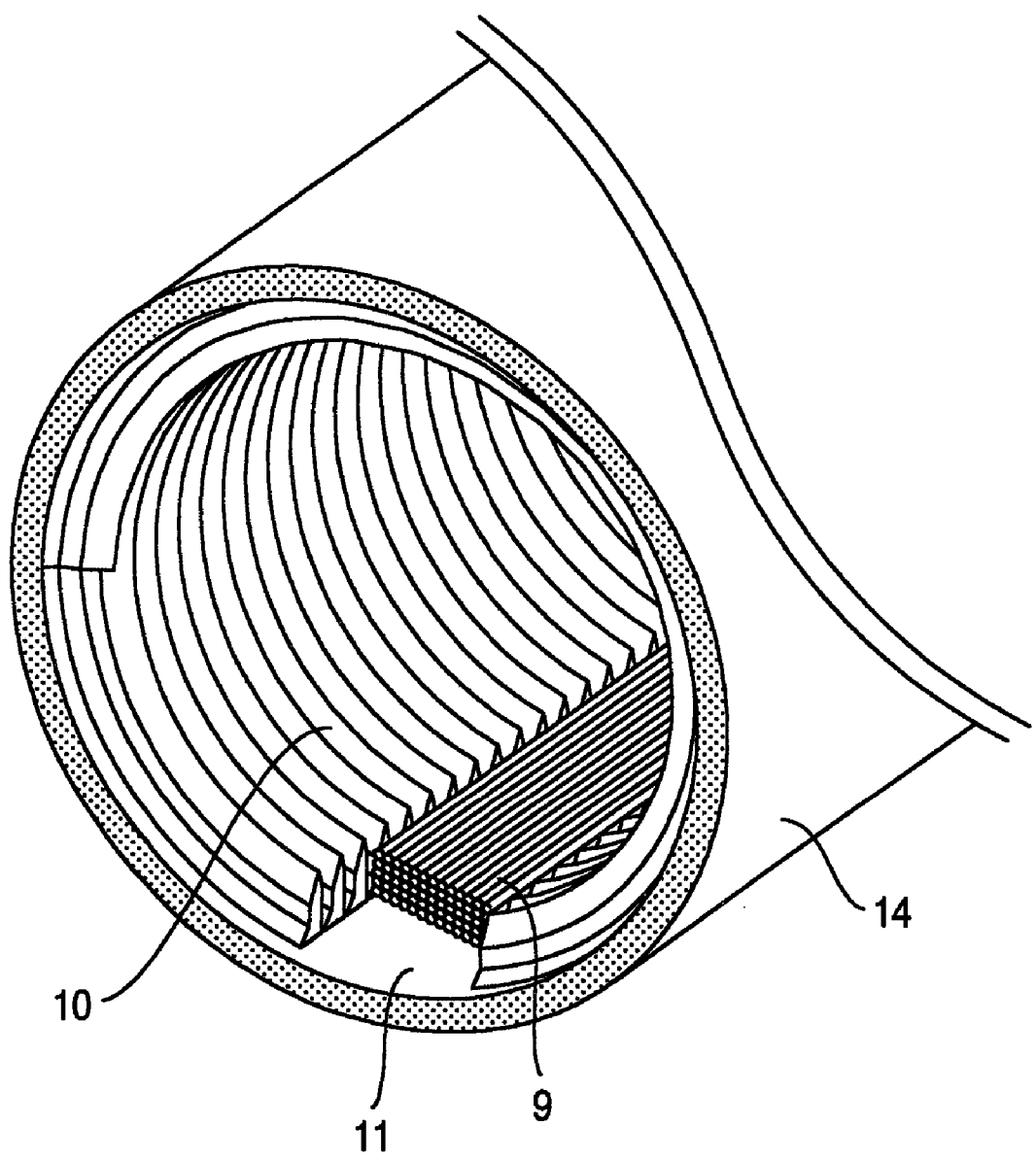
FIG. 5 is a view showing an internal structure of a vapor condensing pipe of an embodiment according to the present invention.

FIG. 5 is a perspective view showing an internal structure of the vapor condensing pipe including the present embodiment.

In FIG. 5, the vapor condensing pipe 14 needs to be horizontally disposed correspondingly to the blade which is swapped horizontally. In order to enhance draining performance of the liquid which is held between the fins 10 by capillary force in the vapor condensing pipe 14 which is horizontally disposed, the liquid is caused to flow to the lower side of the pipe by the gravity by allowing the fin 10 to have an angle close to perpendicularity with respect to a pipe axis direction. Furthermore, a groove 11 substantially parallel with the pipe axis direction is provided on the lower side of the center of the pipe so that the fin section is exposed, and a wick 9 having a wire space smaller than the space between the fins 10 on the pipe inner surface is filled in the groove 11.

In the present embodiment, copper is used for the material of the heat pipe, and water is used for the working fluid. Therefore, copper fine wires which are bundled are used for the wick 9. However, any material can be used as long as it can suck the condensate liquid from between the fins 10 by capillary force, and can keep reliability with occurrence of less corrosion and the like in view of the relationship with the material of the heat pipe 12 and the working fluid.

By exposing the section of the fins, the condensate liquid held between the fins 10 and the wick 9 are in contact with each other, and therefore, water absorbing performance by the capillary force of the wick 9 can be easily exploited. By adopting these structures, the draining performance of the condensate liquid between the fins 10 can be enhanced by both the gravity and the capillary force of the wick 9, and the effect of the area enlargement can be obtained without reducing the heat transfer coefficient even if the fin pitch space is narrowed. Furthermore, reduction in the heat resistance of the vapor condensing pipe 14 can be realized. Further, the capillary force of the wick 9 is useful for passing the liquid to the condensate liquid return pipe 15 against the flowing direction of the vapor, and exhibits effect in maintaining the maximum heat transport amount.

Figure 6:
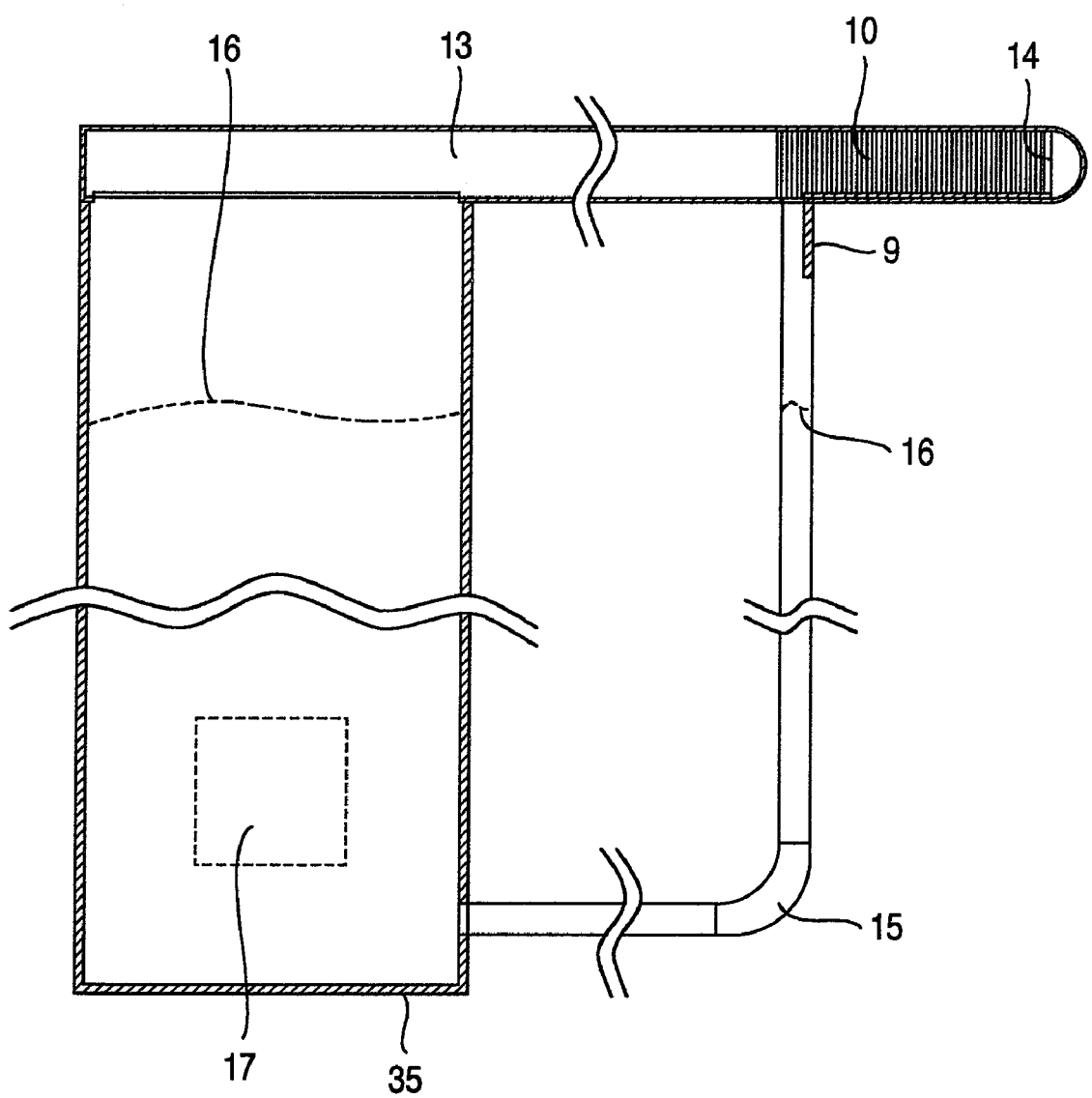
FIG. 6 is a view showing a sectional view of an entire heat pipe of an embodiment according to the present invention.

FIG. 6 shows a sectional view of the heat pipe including the present embodiment.

In FIG. 6, the wick 9 installed at the lower side of the vapor condensing pipe is extended to the condensate liquid return pipe 15 for returning the condensate liquid, and thereby, the working fluid absorbed in the wick 9 flows into the condensate liquid return pipe 15.

By connecting the condensate liquid return pipe 15 to be orthogonal to the vapor condensing pipe 14, the distance between the wick 9 and the working fluid level 16 is made the shortest. Thereby, not only the condensed liquid passes along the wick 9 and reliably reaches the working fluid level 16, but also the flow loss of the condensed working fluid by the wick 9 can be reduced. Accordingly, since the head difference required for driving the heat pipe can be made small correspondingly, the working fluid level 16 can be made high, and stable heat radiation performance at the heat receiving side can be obtained. Further, the flow loss of the condensed working fluid by the wick 9 can be reduced, and therefore, the maximum heat transport amount can be increased.

Embodiment 2

Figure 7:
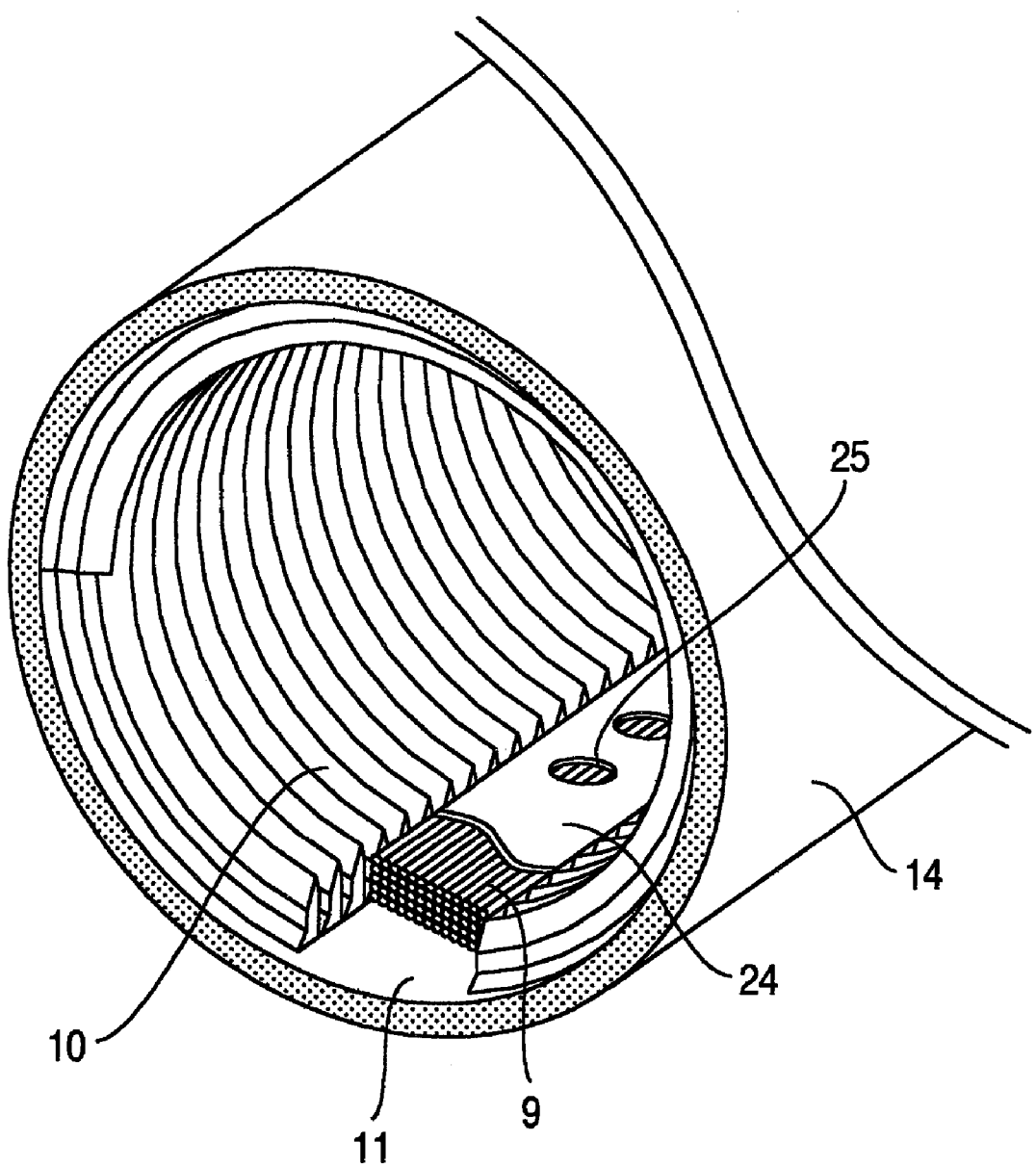
FIG. 7 is a view showing a structure section of the vapor condensing pipe of an embodiment according to the present invention.

FIG. 7 is a partial perspective view of a vapor condensing pipe including another embodiment.

In FIG. 7, the flow of vapor and the flow of condensate liquid flowing in the wick 9 are opposed to each other in the structure of embodiment 1. The condensate liquid returns to the working fluid chamber 35 (shown in FIG. 3) by the capillary force of the wick 9 even under the influence of the flow of vapor, but in order to increase the maximum heat transport amount more, it is desirable to reduce the influence as much as possible. Thus, in the present embodiment, in the vapor condensing pipe 14 shown in embodiment 1, a partition plate 24 having a partition plate opening 25 is provided on the top surface of the wick 9 of the internal structure of the vapor condensing pipe 14, so that the flow of the vapor does not influence the flow of the condensate liquid in the wick 9.

In the structure of the present embodiment, the liquid which is condensed in the fins flows to the wick 9 from the fin sections, and therefore, even if the top surface of the wick 9 is completely covered with the partition plate 24, draining performance is not influenced. Meanwhile, it is conceivable that the liquid condensed in the fin 10 which is located at the upper side in the pipe drops to the lower side of the pipe from the tip end of the fin 10. If the dropped liquid forms droplets on the top surface of the partition plate 24, the droplets are likely to inhibit the flow of the vapor, and therefore, it is effective to provide the partition plate openings 25 partially in the partition plate 24.

By adopting these structures, return of liquid to the condensate liquid return pipe 15 from the vapor condensing pipe 14 is promoted while the heat pipe with low thermal resistance as in embodiment 1 is realized, and which results in the maximum heat transport amount.

Embodiment 3

Figure 8:
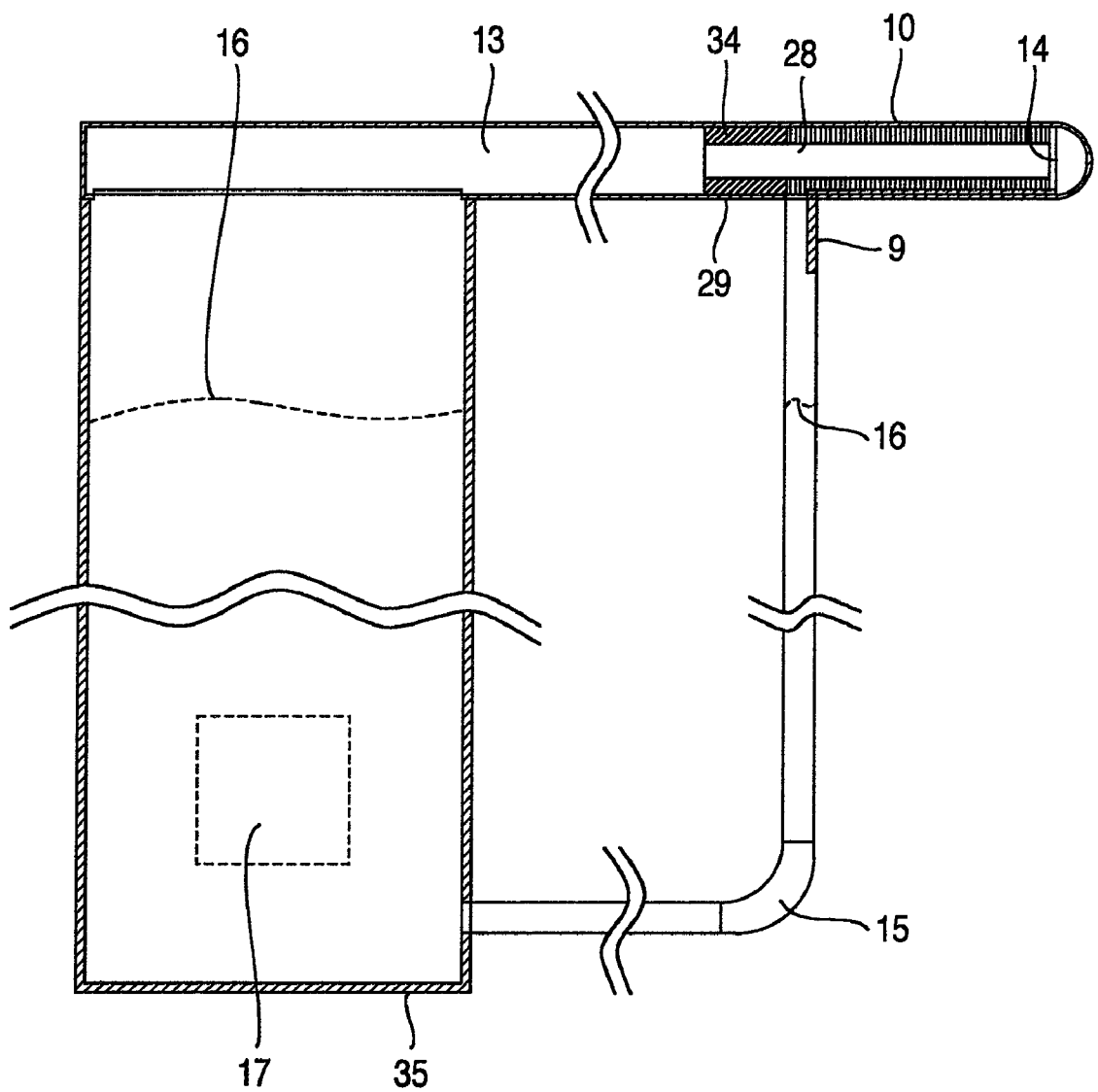
FIG. 8 is a view showing a structure section of a heat pipe of an embodiment according to the present invention.

FIG. 8 is a sectional view of a heat pipe including still another embodiment.

In FIG. 8, in the structure of the vapor condensing pipe 14 shown in embodiment 1, the flow of vapor and the flow of the condensate liquid flowing in the wick 9 are opposed to each other. Thus, an inner vapor pipe 28 is provided inside the vapor condensing pipe 14 via a spacer 34 so as to form the structure in which the vapor from the vapor pipe 13 passes through the inner vapor pipe 28 and is released to the end of the vapor condensing pipe 14. Thereby, the vapor released from the inner vapor pipe 28 flows to the condensate liquid return pipe 15 from the tip end of the heat pipe, and the flow of the vapor is parallel with the flow of the condensate liquid flowing in the wick 9. Therefore, the flow of the condensate liquid flowing in the wick 9 is promoted by the flow of the vapor, and the draining performance to the condensate liquid return pipe 15 is enhanced, which results in increase in the maximum heat transport amount. Further, this increases the draining performance between the fins, and therefore, thermal resistance of the vapor condensing pipe is reduced.

Figure 9:
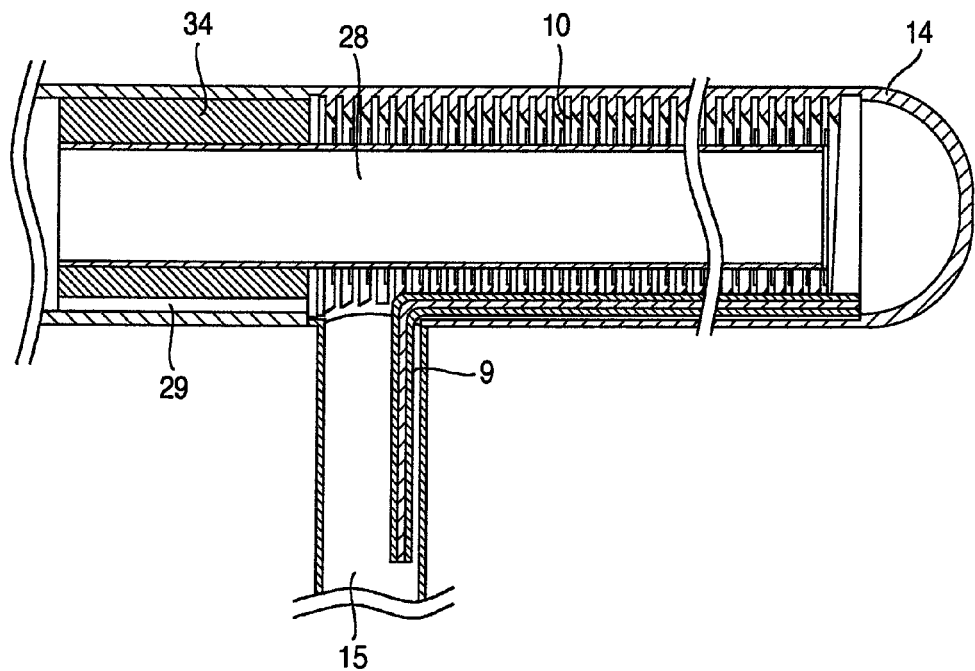
FIG. 9 is an enlarged view of an inner vapor pipe and vapor condensing pipe portion with respect to the heat pipe structure section of an embodiment according to the present invention.

FIG. 9 is a partial enlarged sectional view of the heat pipe of the embodiment described with FIG. 8.

In FIG. 9, the inner vapor pipe 28 is disposed with the distance from the fin tip end of the vapor condensing pipe 14, and the vapor flows in a clearance between the fin and the inner vapor pipe 28. Part of the working fluid which boils in the working fluid chamber 35 (shown in FIG. 3) sometimes flows in the vapor pipe 13 (shown in FIG. 6) in the state of the droplets instead of vapor. In the vapor condensing pipe 14 shown in embodiments 1 and 2, these droplets drop into the condensate liquid return pipe 15 when they flow into the vapor condensing pipe 14. However, as described in the Problems to be Solved, in the structure in which an inner pipe such as the inner vapor pipe 28 is mounted, due to a step between the inner vapor pipe 28 and the vapor pipe 13, the liquid which flows in the vapor pipe 13 stays in the step. Further, the inner vapor pipe 28 is smaller than the vapor pipe 13. Therefore, when the droplets enter the inner portion, the flow resistance of the vapor flow becomes significantly large, which increases the pressure difference at the heat receiving side and the heat radiation side, and is likely to cause difficulty in returning the condensate liquid and reduction in the maximum heat transport amount.

Thus, in the present embodiment, a drain passage 29 is provided on a lower side where the droplets especially stay in the spacer 34 portion of the vapor pipe 13 (shown in FIG. 6) and the inner vapor pipe 28. Thereby, the droplets which flow in the vapor pipe 13 can be allowed to flow to the condensate liquid return pipe 15 without passing the droplets into the inner vapor pipe 28, and the pressure difference between the heat receiving side and the heat radiation side is prevented from being large, and the maximum heat transport amount can be enhanced.

Embodiment 4

Figure 11:
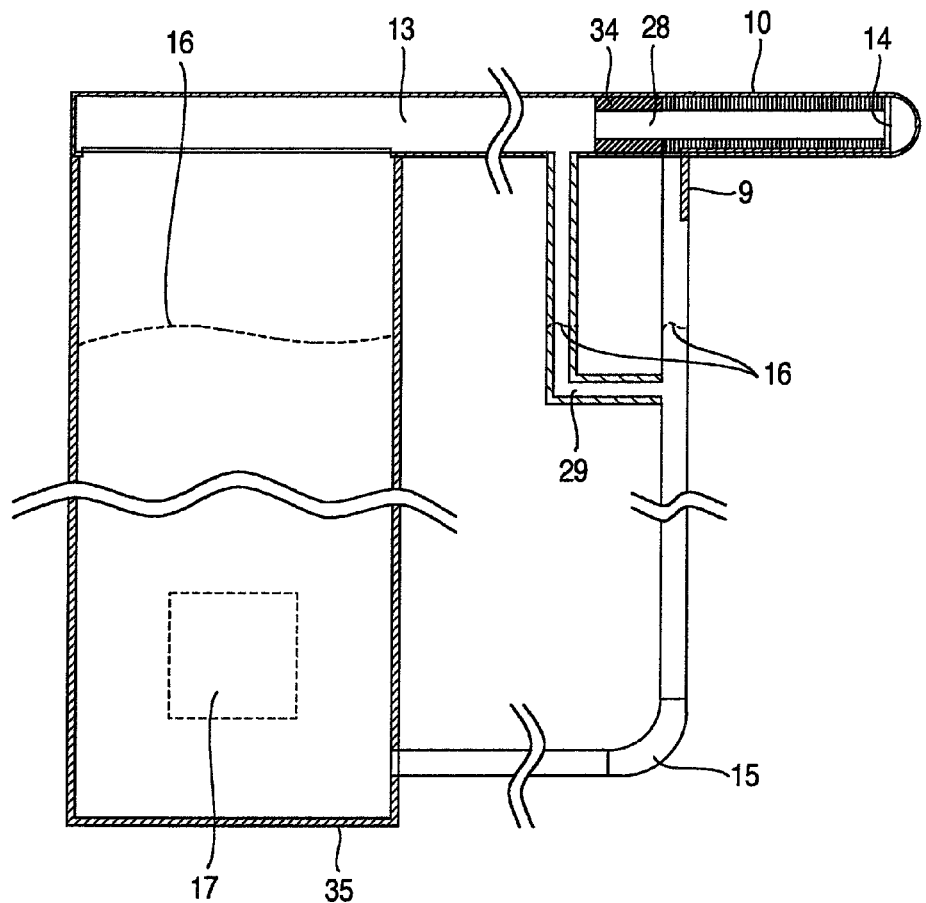
FIG. 11 is a view showing a structure section of the heat pipe of an embodiment according to the present invention.

FIG. 11 is a sectional view of a heat pipe including still another embodiment.

In FIG. 11, in the present embodiment, the drain passage 29 as shown in embodiment 3 is provided as the drain passage 29 by a new pipe which connects the vapor pipe 13 and the condensate liquid return pipe 15 instead of being provided in the spacer 34.

Embodiment 5

Figure 12:
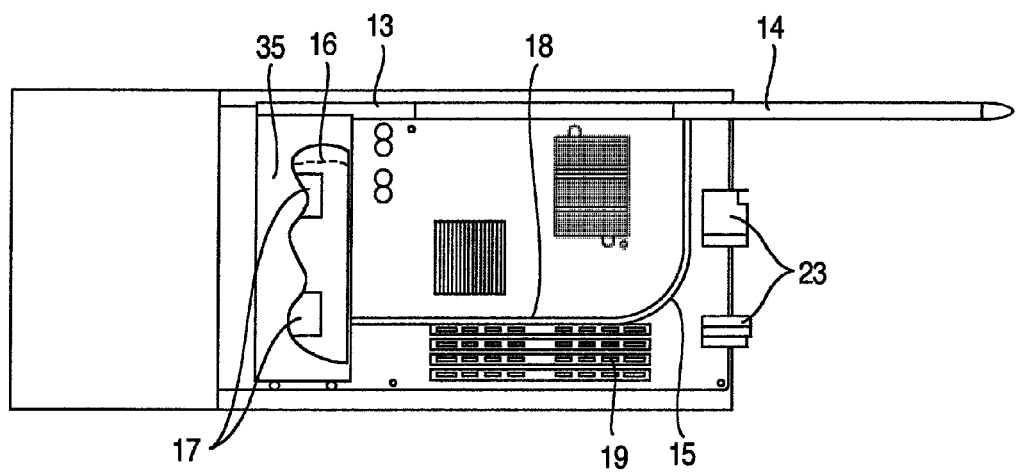
FIG. 12 is a view showing an internal structure of a blade portion removed from the chassis of an embodiment according to the present invention.

FIG. 12 is for explaining still another embodiment, and is a sectional view showing an internal structure of a blade which is removed from the chassis 2.

In FIG. 12, the working fluid which is condensed in the vapor condensing pipe 14 flows into the condensate liquid return pipe 15, and therefore, the condensate liquid return pipe 15 has a relatively low temperature in the entire heat pipe. Further, in recent years, speeding up and integration of the memory 19 have advanced, and with this, heat generation density of the memory 19 has become large. Thus, it is necessary to ensure heat radiation performance for ensuring reliability of a computer. In the present embodiment, the condensate liquid return pipe 15 and the memory 19 are connected with a heat conductive sheet (not illustrated) which is a rubber or the like with flexibility and a heat transfer coefficient higher than an ordinary resin material, therebetween, and the heat of the memory 19 is released to the condensate liquid return pipe 15. In the present embodiment, the heat conductive sheet is illustrated as a memory cooling part 18. In the memory cooling part 18, a size error, an installment error and the like of the condensate liquid return pipe 15 and the memory 19 are absorbed by the flexible connection member.

It is conceivable to fill a heat conductive material in a grease form in between the condensate liquid return pipe 15 and the memory 19 in place of the heat conductive sheet. Further, means is conceivable, which cools the memory 19 by preparing a metal cooling jacket or the like thermally connected to the memory 19 by a heat conducive sheet or the like in advance, and connecting the cooling jacket and the condensate liquid return pipe 15 directly or via the heat conductive sheet or the like. In the present embodiment, only cooling of the memory 19 is mentioned, but the similar cooling effect is obtained by replacing the memory 19 with the semiconductor device on another blade.

The semiconductor device which can be cooled by thermal connection with the condensate liquid return pipe 15 is limited to the heat generator with the heat generation amount by which the working fluid is not boiled in the condensate liquid return pipe 15. This is because the air bubbles which generate in the condensate liquid return pipe 15 flow to the vapor condensing pipe side, and inhibit return of the condensed working fluid to the heat receiving surface.

Embodiment 6

Figure 13:
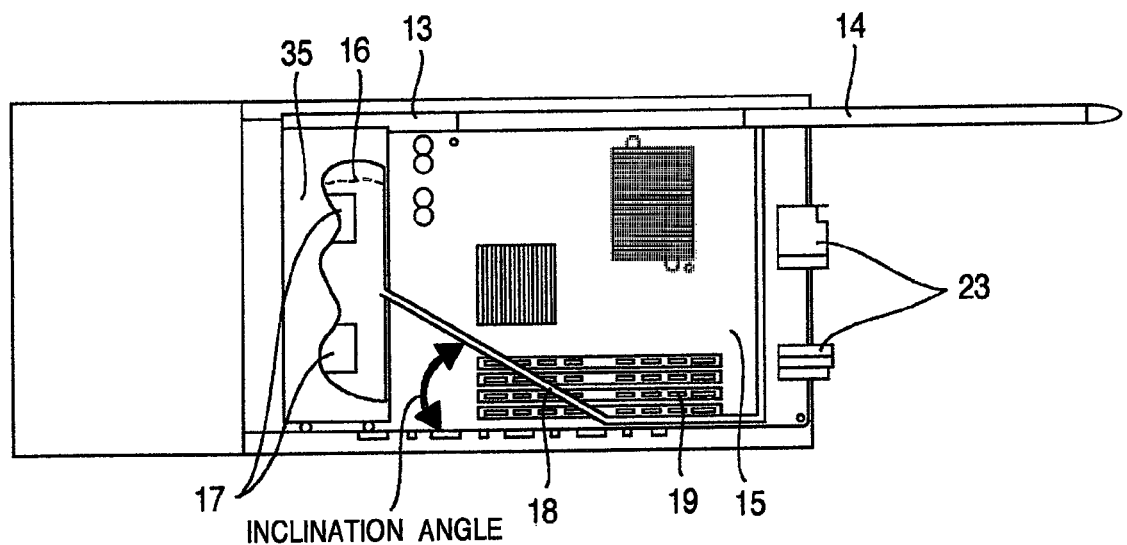
FIG. 13 is a view showing an internal structure of a blade portion removed from the chassis of an embodiment according to the present invention.

FIG. 13 is for explaining still another embodiment, and is a sectional view showing an internal structure of a blade which is removed from a chassis.

In FIG. 13, in the structure shown in embodiment 5, the heat generation amount of the semiconductor device which is cooled by using the condensate liquid return pipe 15 needs to meet the requirement that the working fluid should not be boiled in the condensate liquid return pipe 15. Thus, in the present embodiment, the air bubbles of the vapor boiled in the memory cooling part 18 are caused to flow into the working fluid chamber 35 reliably by the buoyant force.

More specifically, in order to prevent inhibition of return of the working fluid condensed by boiling to the heat receiving surface, a level difference is provided in the memory cooling part 18 of the condensate liquid return pipe 15 and the connection portion of the condensate liquid return pipe 15 and the working fluid chamber 35 so that the connection portion of the condensate liquid return pipe 15 and the working fluid chamber 35 is at a higher position. In concrete, as shown in FIG. 13, the piping extending to the connecting portion of the working fluid chamber 35 from the memory cooling part 18 of the condensate liquid return pipe 15 is inclined from the horizontal surface at an inclination angle.

Embodiment 7

Figure 14:
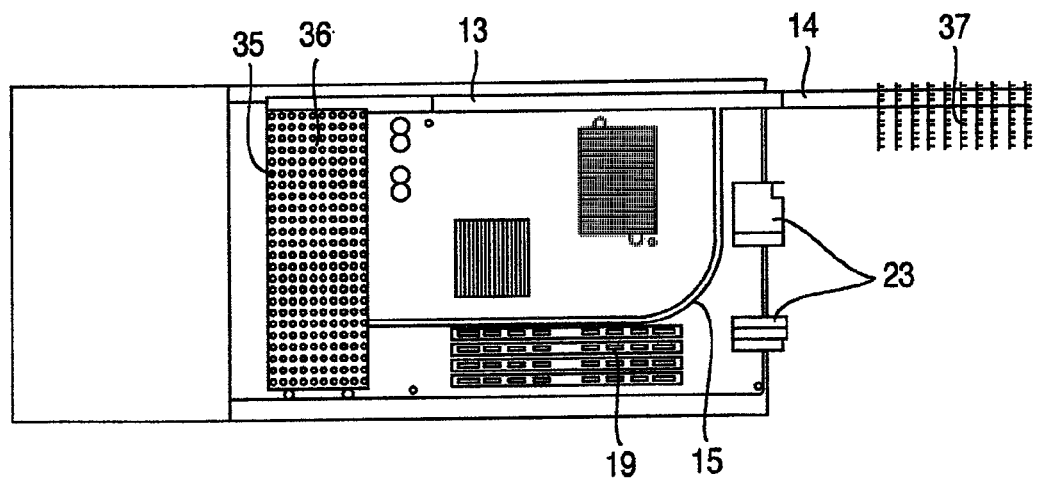
FIG. 14 is a view showing an internal structure of a blade portion removed from the chassis of an embodiment according to the present invention.

FIG. 14 is a sectional view of a blade including another embodiment.

In FIG. 14, a vapor condensing pipe radiation fin 37 which is constructed by a metal plate or the like having a clearance in which air flows is provided on the surface of the vapor condensing pipe 14. The material of the above described vapor condensing pipe radiation fin 37 may be any material if only it has high thermal conductivity, and for example, aluminum, copper, a graphite sheet or a material having a thermal conductivity equivalent to them can be used. The shape is not limited to a plate shape, and any shape or mechanism may be adopted if only they can increase the heat radiation area more than the above described vapor condensing pipe 14. There are cited the method using a block having fins made of, for example, diecast or the like, the method for circulating a liquid in a metal block, the method using a heat pipe and a paper chamber which is a phase change type thermal diffusion device, and the like.

Further, a chamber radiation fin 36 is provided on the outer side of the above described working fluid chamber 35. According to this structure, by passing air to the blade 1 by the fan unit 4 (shown in FIG. 1), heat of the CPU 3 is radiated at two spots that are the above described chamber radiation fin 36 and the above described vapor condensing pipe radiation fin 37 by the heat pipe 12.

Figure 15:
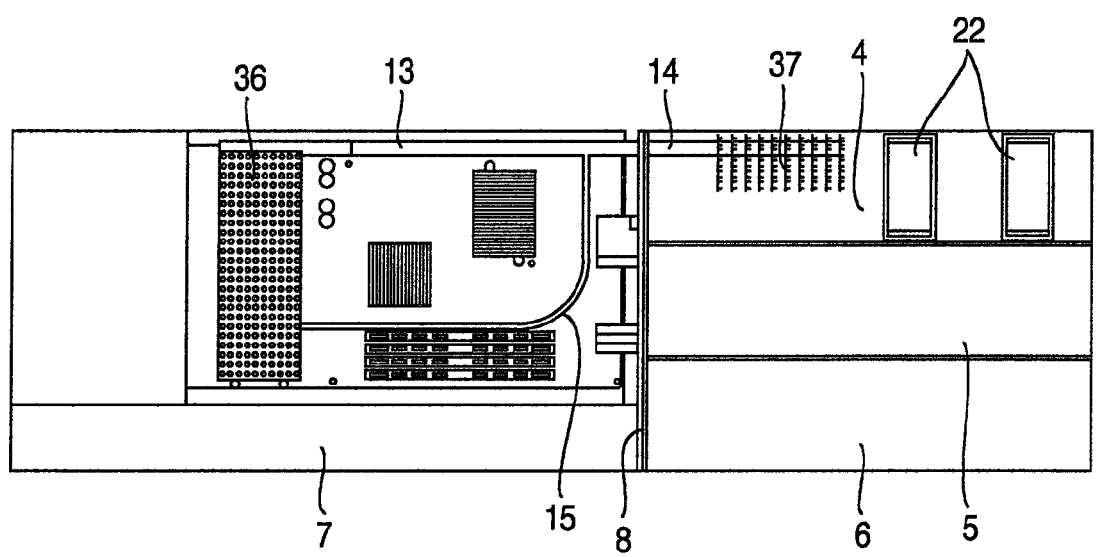
FIG. 15 is a view showing a configuration of the entire blade server of an embodiment according to the present invention.

FIG. 15 is a view showing a state in which the blade described with FIG. 14 is inserted into the chassis.

In FIG. 15, the configuration of the entire blade server is shown. As in the embodiments described so far, air is caused to flow into the chassis 2 to the fan unit side from the insertion side of the blade 1 of the chassis 2 by the fan 22 installed in the fan unit 4, and the semiconductor device on the blade is cooled.

In the present embodiment, the chamber radiation fin 36 is provided in order to enhance heat radiation performance especially in the working fluid chamber 35 of the heat pipe 12.

Further, in the present embodiment, when the blade 1 is inserted into the chassis 2, the above described vapor condensing pipe radiation fin 37 mounted to the surface of the above described vapor condensing pipe 14 is located in the fan unit 4, and the above described vapor condensing pipe can be cooled with the air of the fan 22. Thereby, the heat of the CPU 3 which is transported by the heat pipe 12 can be discharged outside the blade server with the air by the fan 22 without including the constitution of the thermal connector 20 (shown in FIG. 2) and the radiator 21 in the fan unit 4. However, there is no problem if the thermal connector 20 and the radiator 21 are added to this configuration. It goes without saying that in such a case, the above described vapor condensing pipe radiation fin 37 is not mounted to the portion of the surface of the above described vapor condensing pipe 14 which is connected to the thermal connector 20.

It should be further understood by those skilled in the art that although the foregoing description has been made on embodiments of the invention, the invention is not limited thereto and various changes and modifications may be made without departing from the spirit of the invention and the scope of the appended claims.

This application claims priority from Japanese Patent Application 2008-244279, filed Sep. 24, 2008, which is incorporated herein by reference in its entirety.

The invention claimed is:

1. A cooling device comprising a chassis capable of being electrically and mechanically connected to and disconnected from a blade including an electronic circuit substrate having a plurality of semiconductor devices by moving the blade with respect to the chassis in a direction, a heat pipe which includes a heat absorption part for absorbing a heat energy from CPU as at least one of the semiconductor devices and a vapor condensing tube for discharging therefrom the heat energy, and which is attachable to the blade so that the vapor condensing tube extends in its longitudinal direction along the direction when moving the blade with respect to the chassis in the direction, and a heat radiator attached to a surface of the vapor condensing tube to accelerate the heat energy discharge from the vapor condensing tube,
wherein the vapor condensing tube has on its inner surface a groove extending in the longitudinal direction of the vapor condensing tube, spiral fins ends of each of which spiral fins are opposite to each other in a circumferential direction of the inner surface to terminate respectively at the groove, and a bundle of wicks extending longitudinally in the groove.

2. The cooling device according to claim 1, wherein the heat absorption part has a working liquid chamber for containing a working fluid of liquid state so that a liquid level of the working liquid is kept vertically lower than a bottom of the groove, and the heat pipe has a first pipe for fluidal communication between a space on the liquid level and the vapor condensing tube and a second pipe for fluidal communication between the working fluid of liquid state and the vapor condensing tube.

3. The cooling device according to claim 2, wherein the second pipe extends at a position vertically lower than the vapor condensing tube.

4. An electronic equipment comprising a blade including an electronic circuit substrate having a plurality of semiconductor devices, a chassis capable of being electrically and mechanically connected to and disconnected from the blade by moving the blade with respect to the chassis in a direction, a heat pipe which includes a heat absorption part for absorbing a heat energy from CPU as at least one of the semiconductor devices and a vapor condensing tube for discharging therefrom the heat energy, and which is attachable to the blade so that the vapor condensing tube extends in its longitudinal direction along the direction when moving the blade with respect to the chassis in the direction, and a heat radiator attached to a surface of the vapor condensing tube to accelerate the heat energy discharge from the vapor condensing tube,
wherein the vapor condensing tube has on its inner surface a groove extending in the longitudinal direction of the vapor condensing tube, spiral fins ends of each of which spiral fins are opposite to each other in a circumferential direction of the inner surface to terminate respectively at the groove, and a bundle of wicks extending longitudinally in the groove.

5. The electronic equipment according to claim 4, wherein the heat absorption part has at least a fin and a porous surface arranged to be opposed to the at least one of the semiconductor devices in a thickness direction of the substrate.

6. The electronic equipment according to claim 4, wherein the heat absorption part has a working liquid chamber for containing a working fluid of liquid state so that a liquid level of the working liquid is kept vertically lower than a bottom of the groove, the heat pipe has a first pipe for fluidal communication between a space on the liquid level and the vapor condensing tube and a second pipe for fluidal communication between the working fluid of liquid state and the vapor condensing tube, and the second pipe is thermally connected through a thermally conductive member to the other at least one of the semiconductor devices other than the CPU so that the other at least one of the semiconductor devices is cooled by the second pipe.

7. The cooling device according to claim 2, wherein the bundle of wicks extends into the second pipe.

\* \* \* \* \*